US011839040B2

(12) United States Patent
Vaishnavi et al.

(10) Patent No.: US 11,839,040 B2
(45) Date of Patent: Dec. 5, 2023

(54) INTERLOCK MECHANISM FOR A DISTRIBUTION CABINET

(71) Applicant: Eaton Intelligent Power Limited, Dublin (IE)

(72) Inventors: Romil Vaishnavi, Pune (IN); Prashant Savgave, Undri Pune (IN); Abhishek Pratap Rao, Pune (IN)

(73) Assignee: EATON INTELLIGENT POWER LIMITED, Dublin (IE)

(*) Notice: Subject to any disclaimer, the term of this patent is extended or adjusted under 35 U.S.C. 154(b) by 0 days.

(21) Appl. No.: 17/805,192

(22) Filed: Jun. 2, 2022

(65) Prior Publication Data

US 2022/0394864 A1 Dec. 8, 2022

Related U.S. Application Data

(60) Provisional application No. 63/196,909, filed on Jun. 4, 2021.

(51) Int. Cl.
*H05K 5/02* (2006.01)
*E05B 1/00* (2006.01)

(52) U.S. Cl.
CPC ............ *H05K 5/023* (2013.01); *E05B 1/003* (2013.01); *H05K 5/0208* (2013.01); *H05K 5/0247* (2013.01)

(58) Field of Classification Search
None
See application file for complete search history.

(56) References Cited

U.S. PATENT DOCUMENTS

| 5,493,084 | A | * | 2/1996 | Whitaker | H01H 9/22 200/50.05 |
|---|---|---|---|---|---|
| 5,963,420 | A | * | 10/1999 | Bailey | H02B 11/133 361/740 |
| 6,194,983 | B1 | * | 2/2001 | Bogdon | H01H 71/56 335/73 |
| 10,483,058 | B2 | * | 11/2019 | Vaishnavi | H01H 19/24 |
| 10,903,021 | B1 | | 1/2021 | Vaishnavi et al. | |
| 10,937,603 | B1 | | 3/2021 | Vaishnavi et al. | |
| 2015/0364277 | A1 | * | 12/2015 | Fischer | H02B 1/26 200/330 |
| 2017/0125183 | A1 | * | 5/2017 | Andic | E05B 65/06 |
| 2018/0152007 | A1 | * | 5/2018 | Kroushl | H02B 1/306 |
| 2020/0273639 | A1 | * | 8/2020 | Tyleshevski | H02B 1/36 |

* cited by examiner

*Primary Examiner* — Xanthia C Cunningham
(74) *Attorney, Agent, or Firm* — Merchant & Gould P.C.

(57) ABSTRACT

The present disclosure relates to electrical devices housed in a distribution box and, more particularly, to an interlock mechanism for visually indicating whether main contacts operated by the electrical devices are in an open condition or a closed condition.

20 Claims, 13 Drawing Sheets

INTERLOCK MECHANISM FOR A DISTRIBUTION CABINET

TECHNICAL FIELD

The present disclosure relates generally to an electrical switching mechanism including disconnect devices having electrical contacts. More specifically, the present disclosure relates to a safety device for indicating when a disconnect device is actuated.

BACKGROUND

It is common for electric devices such as disconnect devices to be enclosed in distribution cabinets that have an operating handle located on a door or cover of the distribution cabinet. A device operating mechanism is typically located inside the distribution cabinet for switching the disconnect device between ON and OFF positions. In certain situations, when the door of the distribution cabinet is open, the operating handle can be moved to the OFF position while the electronic device remains in the ON position. This may present a false representation of the device condition.

Improvements are needed to provide a visual indication of whether electric devices are activated within a distribution cabinet.

SUMMARY

Aspects of the present disclosure relate to electrical devices housed in a distribution box and, more particularly, to an interlock mechanism for visually indicating whether main contacts operated by the electrical devices are in an open condition or a closed condition.

Aspects of the present disclosure relate to an apparatus that includes a cabinet with a door that has an outside surface and an inside surface. A control handle can be mounted on the outside surface of the door. The control handle can be rotatable about a handle axis between an OFF position and an ON position and the door is movable between an open door position and a closed door position.

The apparatus includes at least one circuit unit positioned within the cabinet. The at least one circuit unit is movable between an open circuit position and a closed circuit position. The control handle can be mechanically linked to the at least one circuit unit to drive movement of the at least one circuit unit between the open and closed circuit positions when: a) the door is closed while the control handle is in the OFF position and the at least one circuit unit is in the open circuit position; and b) the door is closed when the control handle is in the ON position and the at least one circuit unit is in the closed circuit position. When the door is open, the control handle is mechanically isolated from the at least one circuit unit such that the control handle can be moved between the OFF and ON positions without moving the at least one circuit unit between the open and closed circuit positions.

The apparatus also includes a blocking structure that moves with the at least one circuit unit such that the blocking structure is in a first position when the at least one circuit unit is in the open circuit position and is in a second position when the at least one circuit unit is in the closed circuit position. The blocking structure can be configured to prevent the door from being closed when the control handle is in the OFF position and the at least one circuit unit is in the closed position. The blocking structure permits the door to be closed when: a) the control handle is in the OFF position and the at least one circuit unit is in the open circuit position; and b) the control handle is in the ON position and the at least one circuit unit is in the closed circuit position.

Another aspect of the present disclosure relates to an apparatus that includes a cabinet with a door that has an outside surface and an inside surface. A control handle is mounted on the outside surface of the door and is rotatable about a handle axis between an OFF position and an ON position.

The apparatus includes a door link assembly arranged on the inside surface of the door. The door link assembly can include a slider that has engagement prongs that move linearly with the slider between first and second slider positions as the control handle is rotated about the handle axis between the OFF and ON positions.

The apparatus includes at least one circuit unit positioned within the cabinet. The at least one circuit unit includes an actuator shaft that mechanically links the control handle to the at least one circuit unit. The control handle can be configured to drive movement of the at least one circuit unit about a switch axis between open and closed circuit positions when a) the door is closed while the control handle is in the OFF position and the at least one circuit unit is in the open circuit position; and b) the door is closed while the control handle is in the ON position and the at least one circuit unit is in the closed circuit position.

The apparatus can include an interlock mechanism that includes a crank member and a blocking arm coupled to the crank member at a first end. The crank member can be rotatable about a crank axis that corresponds to the switch axis. The crank member interconnects the blocking arm at a pivot location. The blocking arm can have an interference portion and an access portion.

The apparatus can include a mounting bracket mounted within the cabinet. The mounting bracket defines a guide opening through which the blocking arm extends. The blocking arm is adapted to slide within the guide opening relative to the mounting bracket as the crank member pivots about the crank axis. The interference portion of the blocking arm is configured to restrict the door from closing while the control handle is in the OFF position and the circuit unit is in the closed circuit position.

A further aspect of the present disclosure relates to an apparatus that includes a cabinet with a door that has an outside surface and an inside surface. A control handle can be mounted on the outside surface of the door and the control handle can be pivotally movable about a handle axis between an OFF position and an ON position. The door can be movable between an open door position and a closed door position.

The apparatus includes a door link assembly arranged on the inside surface of the door and coupled to the control handle at the handle axis. The door link assembly includes a slider that has engagement prongs. The slider can be moved linearly between first and second slider positions as the control handle is pivoted about the handle axis. The slider is in the first slider position when the control handle is in the OFF position and the slider is in the second slider position when the control handle is in the ON position.

The apparatus includes at least one circuit unit positioned within the cabinet. The at least one circuit unit includes an actuator shaft. The actuator shaft of the circuit unit can be pivotally movable about a switch axis to switch the at least one circuit unit between an open circuit position and a closed circuit position.

The apparatus includes a crank member connected to the actuator shaft at the switch axis for pivoting the actuator shaft to switch the at least one the circuit unit between the open and closed circuit positions. Wherein pivotal movement of the crank member about the switch axis drives pivotal movement of the actuator shaft about the switch axis.

The apparatus includes a blocking arm pivotally connected to the crank member at a pivot location offset from the switch axis. The blocking arm has an interference portion.

The apparatus includes a bracket mounted within the cabinet. The bracket defines a guide opening through which the blocking arm extends. The blocking arm is adapted to slide within the guide opening relative to the mounting bracket as the crank member pivots about the switch axis. The engagement prongs of the slider are configured to engage the crank member when the door is closed such that the movement of the slider by the control handle between the first and second slider positions drives pivotal movement of the crank about the switch axis to cause the at least one circuit unit to move between the open and closed circuit positions. The engagement prongs properly engage the crank member when: a) the door is closed while the control handle is in the OFF position and the at least one circuit unit is in the open circuit position; and b) the door is closed when the control handle is in the ON position and the at least one circuit unit is in the closed circuit position. When the door is open, the engagement prongs are disengaged from the crank member such that the control handle can be moved between the OFF and ON positions without moving the at least one circuit unit between the open and closed circuit positions. The interference portion of the blocking arm is configured to oppose the engagement prongs to restrict the door from closing while the control handle is in the OFF position and the at least one circuit unit is in the closed position.

These and other features and advantages will be apparent from a reading of the following detailed description and a review of the associated drawings. It is to be understood that both the foregoing general description and the following detailed description are exemplary and explanatory only and are not restrictive of the broad concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Reference will now be made in detail to the exemplary aspects of the present disclosure that are illustrated in the accompanying drawings. Wherever possible, the same reference numbers will be used throughout the drawings to refer to the same or like structure.

Circuit switching devices (e.g., disconnect devices) are typically housed in a distribution cabinet or box that includes a door or cover. Circuit switching devices are generally old and well-known in the art. Example disconnect devices are disclosed in U.S. Pat. No. 10,937,603. Such disconnect devices are used to protect electrical circuitry from damage due to an overcurrent condition, such as an overload and relatively high-level short circuit condition. Molded case disconnect devices, for example, include at least one pair of separable contacts which may be operated either manually by way of a handle disposed on the outside of the distribution cabinet which may be arcuately operated between an ON position and an OFF position. The disconnect devices may be switched between ON and OFF conditions by an operating mechanism controlled by the handle of the distribution cabinet.

For a variety of reasons, the operating mechanism and the handle may be disconnected allowing the handle to be inadvertently moved to the OFF position while the door of the distribution cabinet is closed, and disconnect devices are ON. This situation may present a false representation of the device condition and give an impression that the disconnect devices are disconnected and contain no power or electricity.

The present disclosure solves this problem by including a interlock mechanism that does not allow the door of the distribution cabinet to close unless either the handle shows an ON position while the disconnect devices are ON or the disconnect devices are OFF and the handle is in the OFF position.

Figure 1:
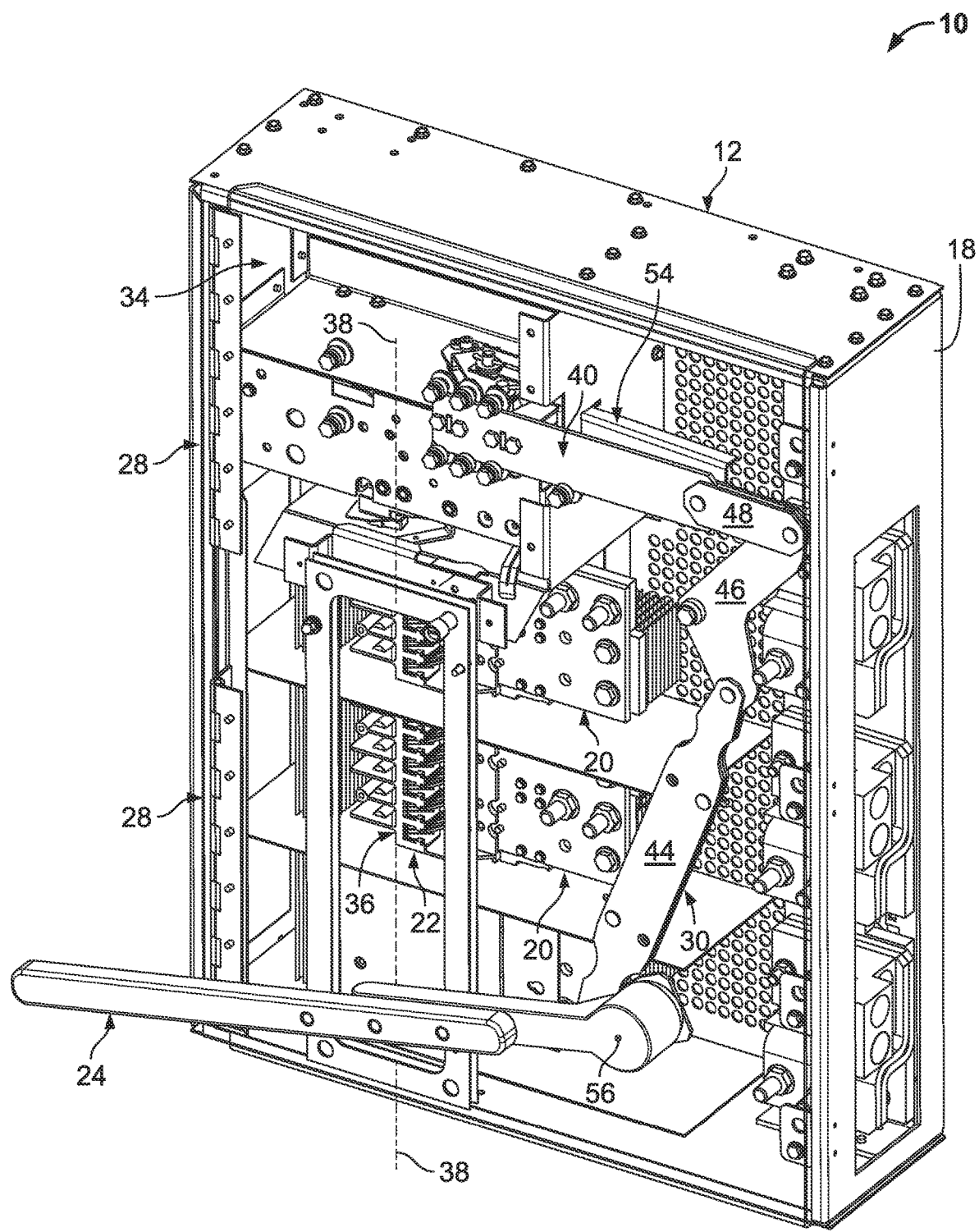
FIG. 1 illustrates a perspective view of an example distribution box including a control handle in accordance with principles of the present disclosure.

Referring to FIG. 1, an example apparatus 10 is shown. The apparatus 10 includes an electrical enclosure 12 (see FIG. 2). While the example embodiment discussed herein is with reference to the electrical enclosure 12, other types of enclosures (e.g., junction boxes, control panels, lighting panels, motor control centers, switchgear cabinets, relay cabinets) or any other type of enclosure (e.g., a flame-proof enclosure) may be used.

The electrical enclosure 12 includes a cover or door 16 (see FIG. 2) and a body 18. The door 16 and body 18 can be fabricated of a material, e.g., steel, cast iron, and the like. The electrical enclosure 12 can be used to house electrical equipment, such as, disconnect devices 20 and switches 22. Motor starters, relays, terminals and meters may also be housed in the electrical enclosure 12. The electrical enclosure 12 may also include a control handle 24 mounted to a front face 26 (e.g., exterior surface)(see FIG. 11) of the door 16 for controlling various features of the electrical equipment housed therein. The control handle 24 can be configured to move about a first arc of rotational motion between a first operating configuration and a second operating configuration. In the depicted example, the first operating configuration can be a power-on configuration and the second operating configuration can be a power-off configuration (shown in FIG. 1), although alternatives are possible.

In some applications, one or more hinges 28 may be positioned along a side of the door 16 and a corresponding side of the body 18. This application depicts two hinges 28 that are shown positioned on a side of the door 16 and the body 18. In other applications, there may be no hinges coupling the door 16 to the body 18. The door 16 may swing outward (i.e., an open position) from the body 18 about the hinges 28 to allow access within the body 18. The hinges 28 can be of any configuration, shape, and/or size. The hinges 28 allow the door 16 to swing away from the body 18 along the hinges 28. Other devices, such as, but not limited to, one or more other claps systems, some other fastening feature, or any combination thereof, may be used to provide a hinge. It will be appreciated that one having ordinary skill in the art will recognize that the hinges 28 can be positioned on any side of the electrical enclosure 12.

Figure 2:
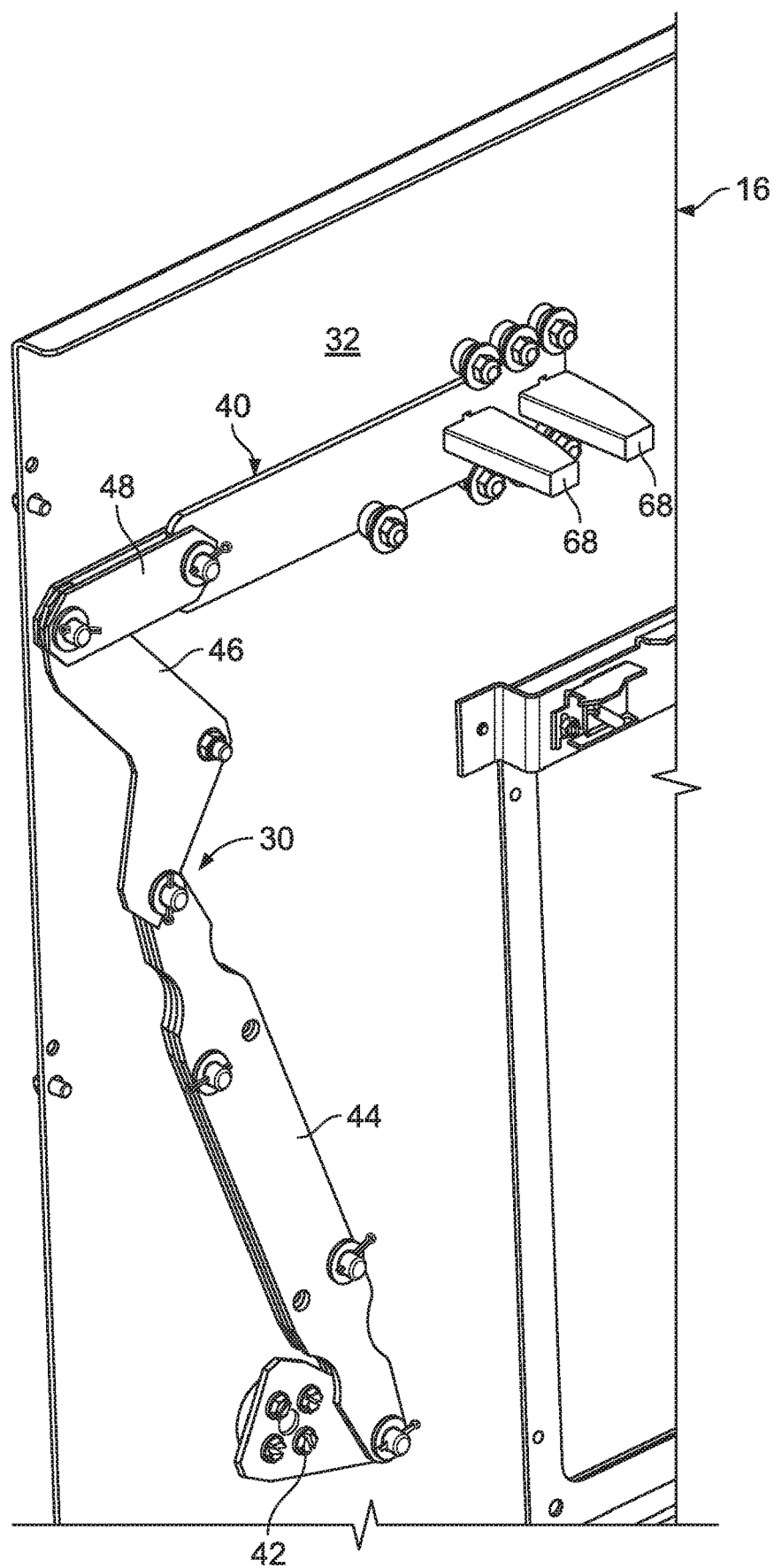
FIG. 2 illustrates a perspective view of the distribution box of FIG. 1 with a door including an operating mechanism mounted thereon.

Turning to FIG. 2, an operating mechanism 30 (e.g., linkage, door link assembly) is depicted on an interior surface 32 of the door 16. An example operating mechanism is disclosed in U.S. Pat. No. 10,937,603, which is incorporated herein by reference in its entirety. The body 18 defines a chamber 34 (e.g., cavity, interior) for receiving the switches 22 and disconnect devices 20 (e.g., at least one circuit unit). Each disconnect device 20 includes an assembly of electrical contacts that are switchable between open and closed conditions. Each disconnect device 20 further includes an actuating shaft 36 that is linked with the electrical contacts in the respective disconnect device 20 to shift the electrical contacts between their open and closed conditions upon rotation of the actuating shaft 36 between open and closed positions. The actuating shafts 36 are centered on a common switch axis 38 (see FIG. 1) reaching horizontally across the inside of the electrical enclosure 12 and are interconnected end-to-end throughout the row of disconnect devices 20 so as to rotate together about the switch axis 38. The disconnect devices 20 are thereby engaged with one another to be switched together such that all of the disconnect devices 20 in the switching assembly have the same condition, either open or closed, at any given time.

The operating mechanism 30 is provided for rotating the actuator shafts 36 in response to movement of the control handle 24 between the first and second operating configurations. The operating mechanism 30 includes a slider 40 that is supported for sliding movement horizontally between first and second slider positions. The operating mechanism 30 also includes links 42, 44, 46, and 48. The links 42-48 are pivotally coupled in series to slide the slider 40 in response to pivotal movement of the control handle 24. The operating mechanism 30 can be coupled to the control handle 24 via an interlock arrangement (not shown). The control handle 24 can be mechanically linked to the disconnect devices 20 to drive movement of the disconnect devices 20 between the open and closed circuit positions when: a) the door is closed while the control handle 24 is in the OFF position and the disconnect devices 20 are in the open circuit position; and b) the door is closed when the control handle 24 is in the ON position and the disconnect devices 20 are in the closed circuit position.

The door 16 of the electrical enclosure 12 may be opened whenever the control handle 24 of the disconnect device 20 is in the power-off configuration in which case the disconnect devices 20 are open (e.g., open circuit position). The door 16 may be closed whenever the control handle 24 of the disconnect devices 20 are in the power-on configuration in which case the disconnect devices 20 are closed (e.g., closed circuit position). There are circumstances in which authorized personnel (i.e., hospital maintenance, etc.) may need to have access to the electrical equipment within the electrical enclosure 12 while electric current is running. As such, the door 16 may be opened while not disconnecting the load by using a defeat mechanism. The defeat mechanism may include a separate tool that allows authorized personnel to defeat and unlock the door 16 and a power shut down can be avoided. Because the door 16 can be opened, a disconnection between the operating mechanism 30 and the control handle 24 occurs while the disconnect devices 20 are ON or in a closed circuit position. With the disconnection between the operating mechanism 30 and the control handle 24, the control handle 24 can be inadvertently moved to the power-off configuration while the door 16 is opened. That is, when the door 16 is open, the control handle 24 can be mechanically isolated from the disconnect devices 20 such that the control handle 24 can be moved between the OFF and ON positions without moving the disconnect devices 20 between the open and closed circuit positions.

Figure 3:
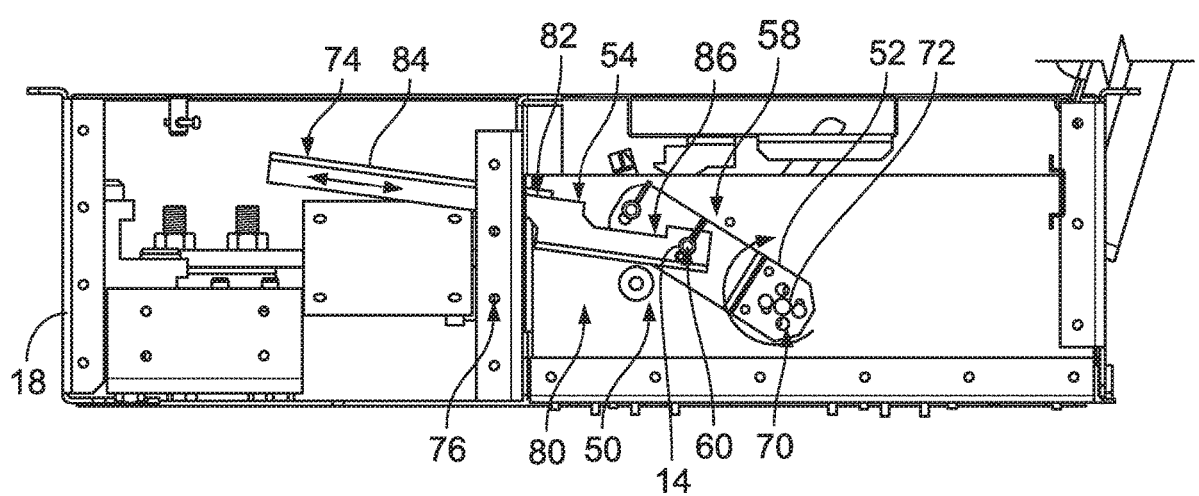
FIG. 3 illustrates a top view of the distribution box showing an interlock mechanism in accordance with the principles of the present disclosure.
Figure 4:
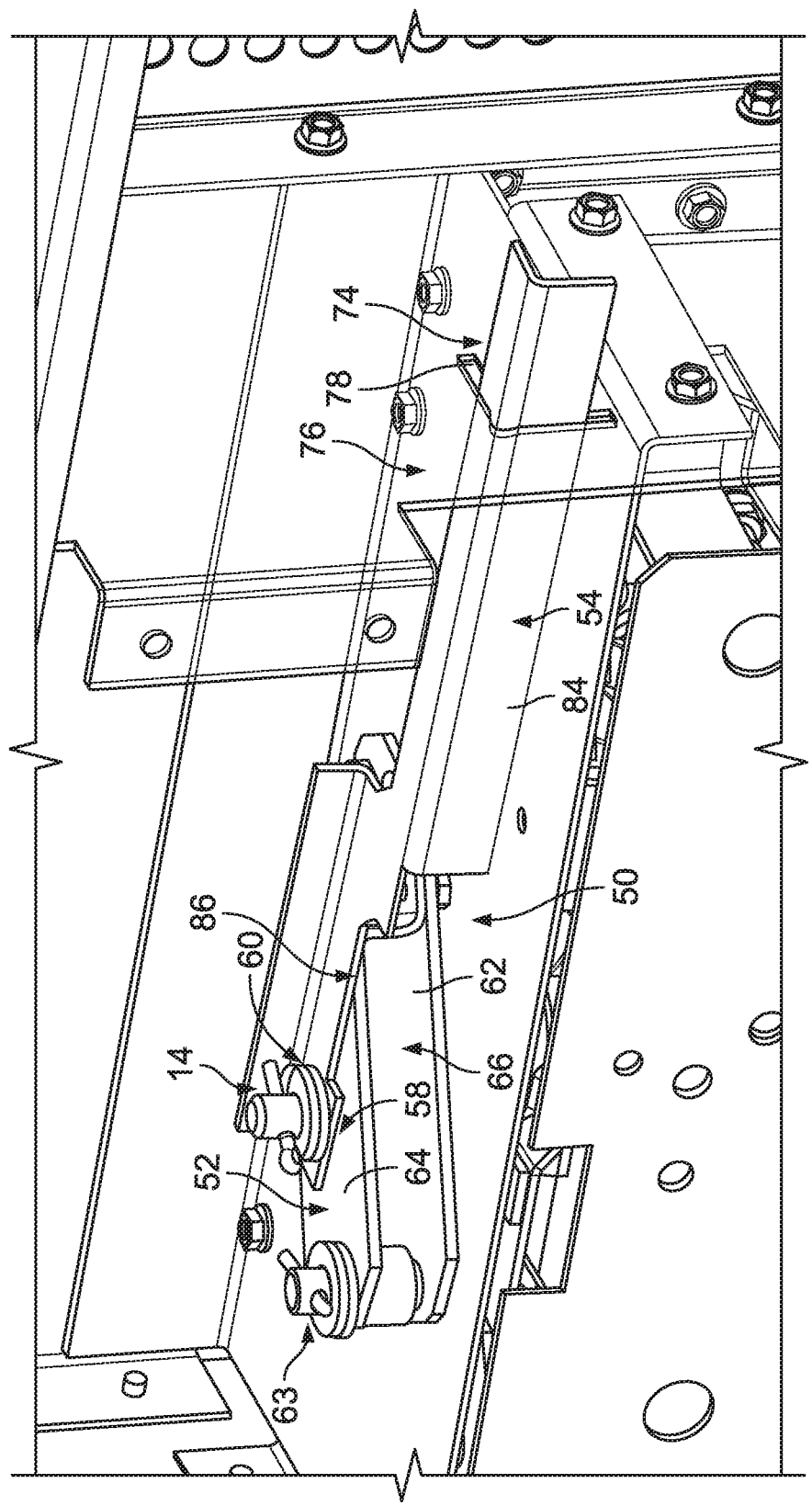
FIGS. 4-11 illustrate multiple views illustrating functionality of the interlock mechanism relative to the operating mechanism.
Figure 5:
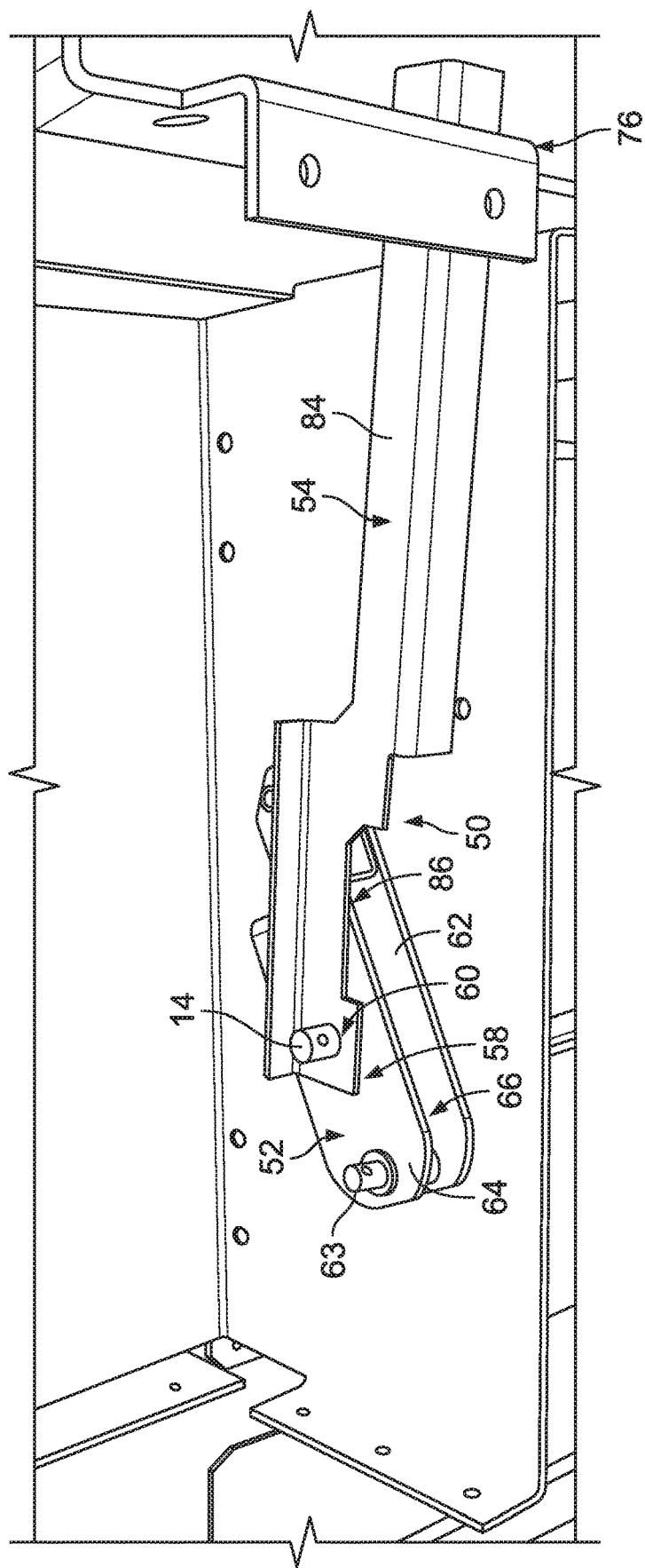

Referring to FIGS. 3-5, in accord with the principles described, the electrical enclosure 12 includes an advantageous, interlock mechanism 50 to indicate the proper operation condition of electrical devices therein such that there is no false representation of the condition of the disconnect devices 20 when the door 16 is open and there is connected power or electricity. The interlock mechanism 50 can be used to indicate the proper position of the control handle 24 when disconnected from the operating mechanism 30.

Turning to FIGS. 3-5, the interlock mechanism 50 can include a crank member 52 (e.g., lever) and a blocking arm 54 (e.g., blocking structure) coupled to the crank member 52. The crank member 52 can be configured to interconnect the blocking arm 54 at a first end 58 of the blocking arm 54 at a pivot location 60 that includes a mechanical fastener 14 (e.g., nut, stud, linear member, shaft, screw). That is, the blocking arm 54 can be pivotally connected to the crank member 52 at the pivot location 60 offset from the switch axis 38. The crank member 52 can be connected to the actuator shaft 36 at the switch axis 38 for pivoting the actuator shaft 36 to switch the disconnect devices 20 between the open and closed circuit positions. Pivotal movement of the crank member 52 about the switch axis 38 drives pivotal movement of the actuators shaft 36 about the switch axis 38.

The crank member 52 includes a first flange 62 and a second flange 64 that are attached together via fasteners 63. The first and second flanges 62, 64 are separated to define an opening 66 of the crank member 52. The slider 40 can be moved linearly between first and second slider positions as the control handle 24 is pivoted about a handle axis 56 (see FIG. 1). The slider 40 can be in the first slider position when the control handle 24 is in the OFF position and the slider 40 can be in the second slider position when the control handle 24 is in the ON position.

Rotation of the control handle 24 pivots the crank member 52 to allow the actuating shafts 36 to pivot the disconnect devices 20 between their open and closed circuit positions. The crank member 52 can be configured to pivot between a first crank position (see FIG. 3) and a second crank position (see FIG. 11) as indicated by arrow 70 (see FIG. 3). When the crank member 52 is in the first crank position, the disconnect devices 20 are in their open circuit position and when the crank member 52 is in the second crank position, the disconnect devices 20 are in their closed circuit position. The crank member 52 can have a degree of freedom of rotation about a crank axis 72 (see FIG. 3) and acts as an actuator for the device operation. The crank member 52 can be rotatable about the crank axis 72 which corresponds to the switch axis 38.

In certain examples, the crank member 52 can have about 120° angle of rotation, although alternatives are possible. In other examples, the crank member 52 can have an angular rotation of at least about 90°. In other examples, the crank member 52 can have an angular rotation of no greater than about 180°. In still other examples, the crank member 52 may have an angular rotation between about 45° and about 150°.

Figure 11:
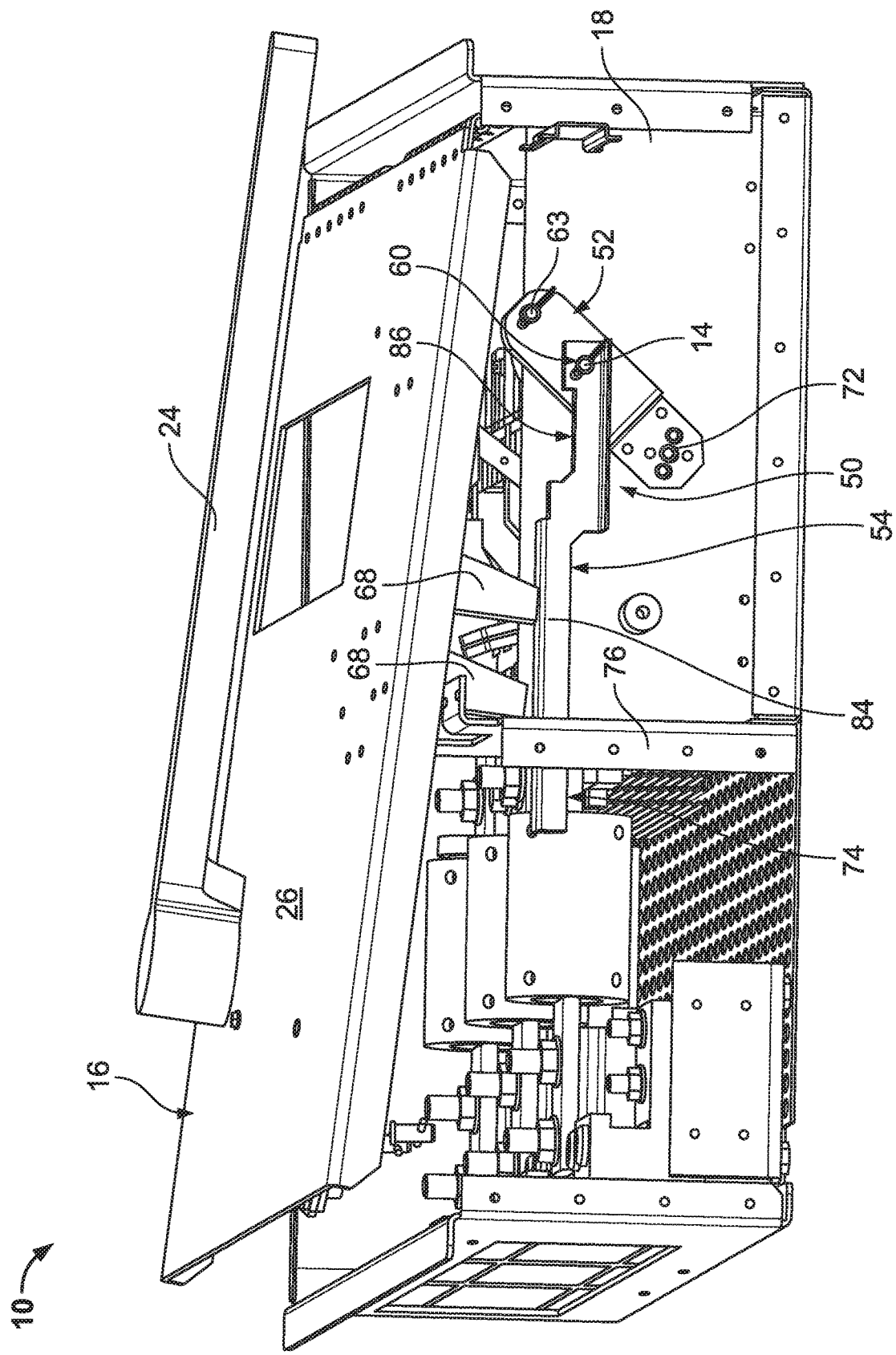

The blocking arm 54 can be configured, upon rotation of the crank member 52 by the control handle 24, to move linearly between a retracted position (e.g., a first position) (see FIG. 3) and an engaged position (e.g., a second position)(see FIG. 11). That is, the crank member 52 can be configured to pull the blocking arm 54 upon movement of the crank member 52 about the crank axis 72. The blocking arm 54 can rotate up to about 30° from horizontal when moved between the retracted and engaged positions. The blocking arm 54 moves with the disconnect device 20 such that the blocking arm 54 is in the retracted position when the disconnect devices 20 are in the open circuit position and is in the engaged position when the disconnect devices 20 are in the closed circuit position.

A second end portion 74 of the blocking arm 54 can be located and guided in position by a mounting bracket 76. The mounting bracket 76 can be fixed in position and mounted within the electrical enclosure 12. The mounting bracket 76 defines a guide opening 78 (see FIG. 4) through which the second end portion 74 of the blocking arm 54 extends to help stabilize the blocking arm 54 as the crank member 52 is pivoted about the switch axis 38. The blocking arm 54 is adapted to slide within the guide opening 78 relative to the mounting bracket 76 as the crank member 52 pivots about the switch axis 38. The guide opening 78 of the mounting bracket 76 can be a L-shaped slot configured to match a cross-sectional shape of the blocking arm 54. The blocking arm 54 can include a L-shaped flange configured to engage the L-shaped slot of the mounting bracket 76.

The crank member 52, blocking arm 54 and the mounting bracket 76 can form a three-bar mechanism 80 in which a higher pairing joint 82 is provided between the blocking arm 54 and the mounting bracket 76 give the three-bar mechanism 80 a degree of freedom. In the depicted examples, the blocking arm 54 includes an interference portion 84 (e.g., flange portion) and an access portion 86 (e.g., recess, opening, cutout). The interference portion 84 can correspond to the L-shaped flange of the blocking arm 54. The blocking arm 54 permits the door 16 to be closed when a) the control handle 24 is in the OFF position and the disconnect devices 20 are in the open circuit position; and b) the control handle 24 is in the ON position and the disconnect devices 20 are in the closed circuit position.

Figure 6:
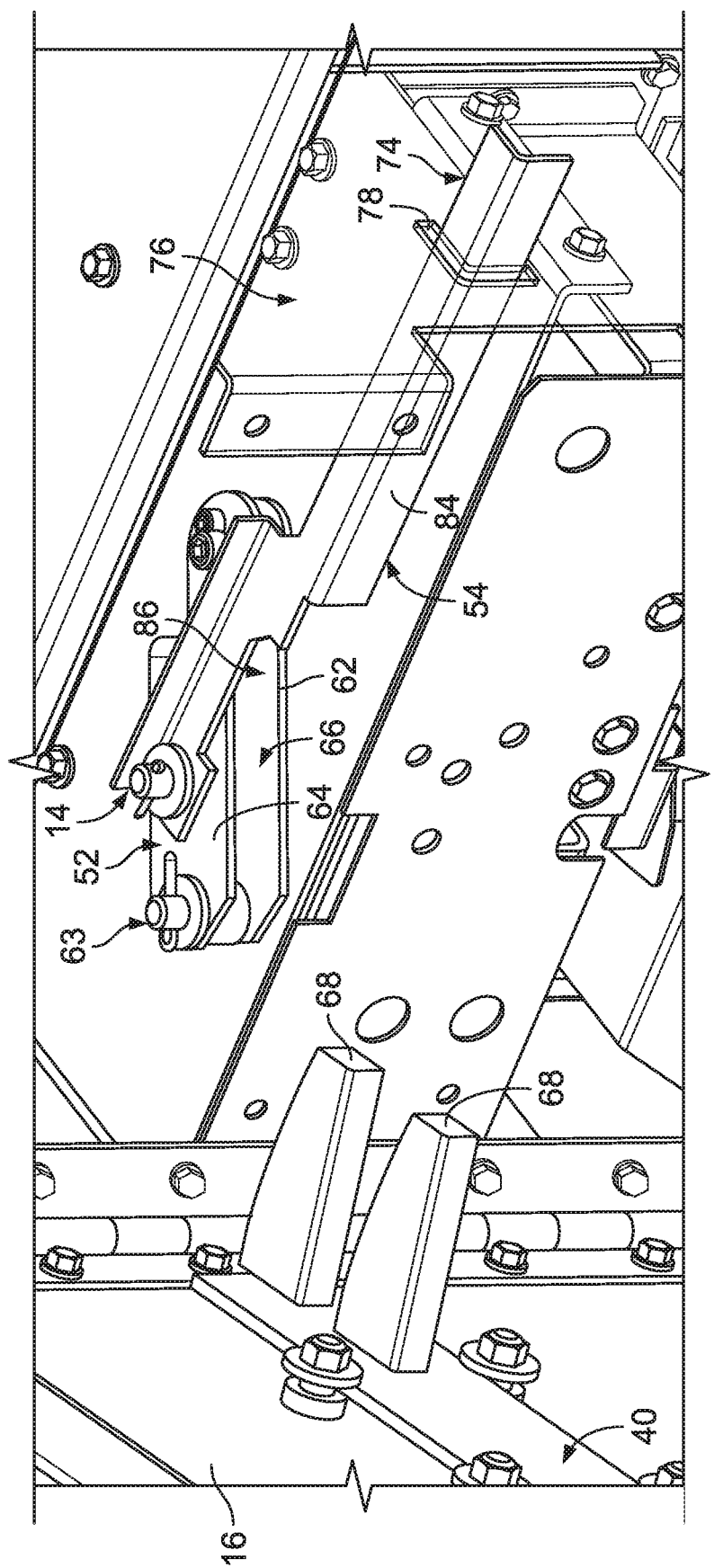

Turning to FIGS. 6-9, the operation of the interlock mechanism 50 will be described. FIG. 6 shows the door 16 in the open position with engagement prongs 68 shown prior to engagement with the crank member 52. When the blocking arm 54 is in the retracted position, the control handle 24 can be in the OFF position, the disconnect devices 20 can be in the open circuit position, and the crank member 52 can be in the first crank position such that the access portion 86 of the blocking arm 54 permits the engagement prongs 68 of the slider 40 to move freely through the opening 66 of the crank member 52.

Figure 7:
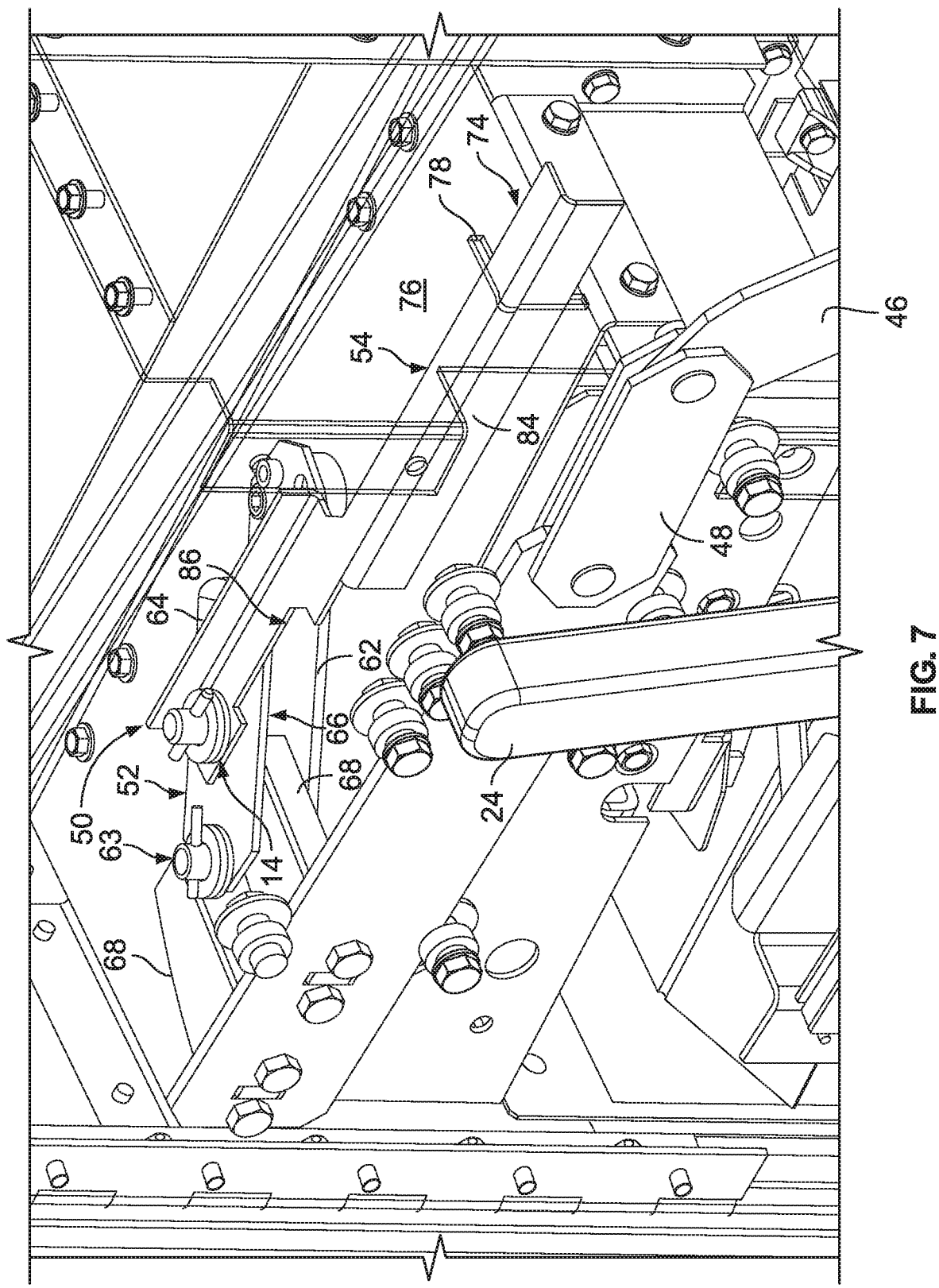

FIG. 7 shows the engagement prongs 68 of the slider 40 engaged with the crank member 52 when the door 16 is closed such that the movement of the slider 40 by the control handle 24 between the first and second slider positions drives pivotal movement of the crank member 52 about the switch axis 38 to cause the disconnect devices 20 to move between the open and closed circuit positions. Upon rotation of the control handle 24 to the ON position, the slider 40 moves linearly from the first slider position to the second slider position allowing the engagement prongs 68 to engage the crank member 52.

Figure 8:
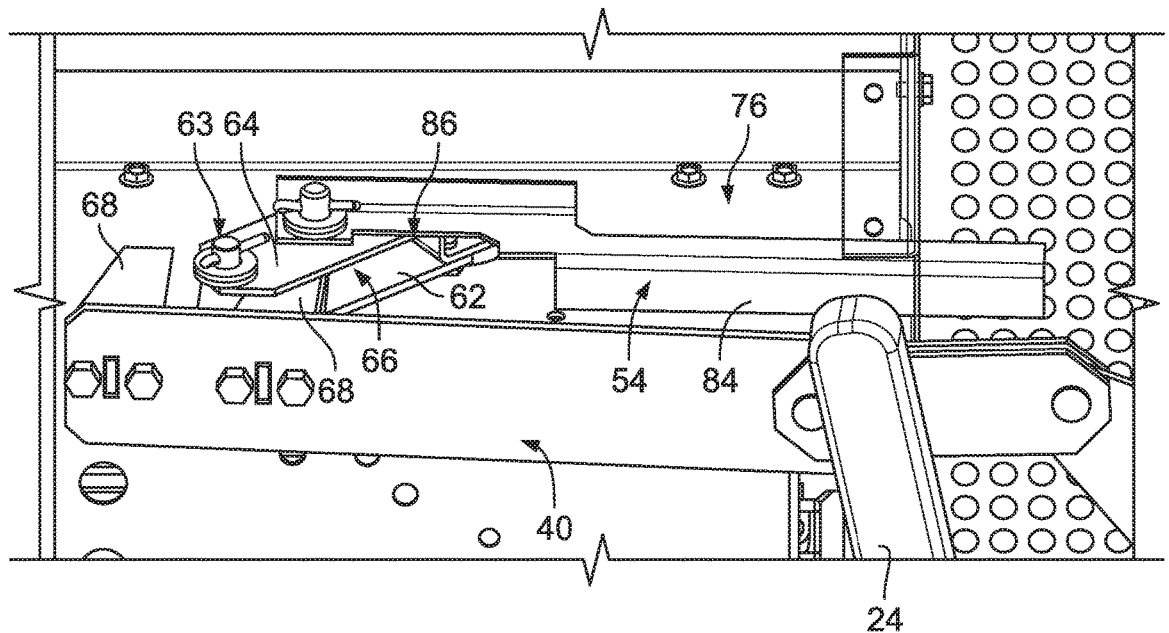
Figure 9:
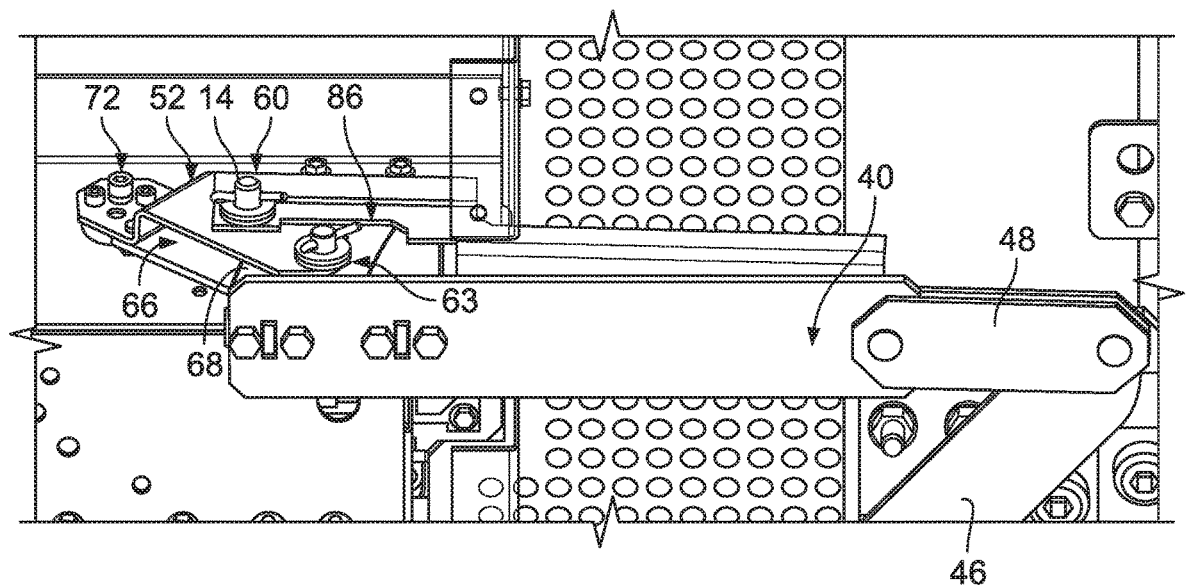

Referring to FIGS. 8-9, the engagement prongs 68 of the slider 40 are movable with the slider 40 to pivot the crank member 52 from the first crank position to the second crank position such that the disconnect devices 20 are switched from the open circuit position to the closed circuit position and the blocking arm 54 moves from the retracted position to the engaged position. As shown, one of the engagement prongs 68 is received in the opening 66 of the crank member 52 to drive the pivotal movement of the crank member 52 about the switch axis 38 to cause the disconnect devices 20 to move between the open and closed circuit positions. The engagement prongs 68 properly engage the crank member 52 when: a) the door 16 is closed while the control handle 24 is in the OFF position and the disconnect devices 20 are in the open circuit position; and b) the door 16 is closed when the control handle 24 is in the ON position and the disconnect devices are in the closed circuit position.

When the control handle 24 is in the OFF position, the door 16 can be securely shut such that engagement prongs 68 (see FIG. 2) of the slider 40 can enter the opening 66 of the crank member 52. Upon rotation of the control handle 24 from the OFF position to the ON position, the crank member 52 can be pivoted as the slider 40 moves from the first slider position to the second slider position.

The electrical enclosure 12 can be defeated by an authorized user to gain access without shutting off the power. If this occurs, the engagement prongs 68 of the slider 40 may no longer be connected to the interlock mechanism 50. That is, when the door 16 is open, the engagement prongs 68 are disengaged from the crank member 52 such that the control handle 24 can be moved between the OFF and ON positions without moving the disconnect devices 20 between the open and closed circuit positions. As such, the control handle 24 may be moved from the ON position to the OFF position while the door 16 is opened and the equipment is ON.

Figure 10:
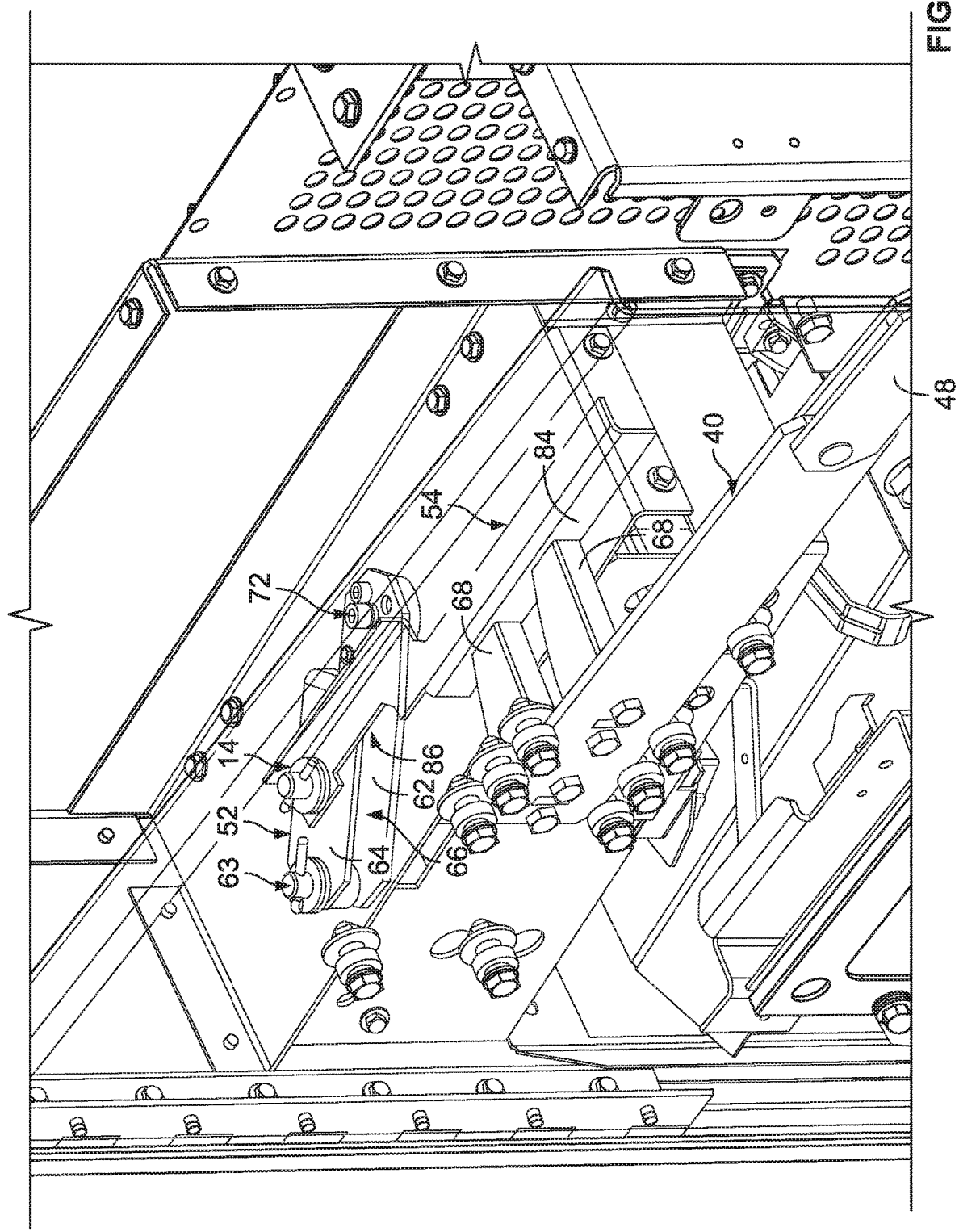

Turning to FIGS. 10-11, the blocking arm 54 can be configured to prevent the door 16 from being closed when the control handle 24 is in the OFF position and the disconnect devices 20 are in the closed circuit position. That is, the interference portion 84 of the blocking arm 54 can be configured to oppose the engagement prongs 68 to restrict the door 16 from closing while the control handle 24 is in the OFF position and the disconnect devices 20 are in the closed circuit position. This will indicate to the personnel that the control handle 24 is not in the correct position. That is, in order to shut the door 16 after it has been defeated, the control handle 24 would need to be moved to the correct, ON position to allow the engagement prongs 68 to be permitted to engage the opening 66 of the crank member 52 through the access portion 86 as the blocking arm 54 is moved to the retracted position. As such, the appropriate condition of a powered ON system can be indicated to an observer.

As used herein, the term, "between" and variants thereof, in this context, means that the disconnect devices 20, control handle 24, crank member 52, and blocking arm 54, may be moved in a direction from either one of the first recited position toward the second or the second recited position toward the first. Unless specifically stated, the motion is entirely between the two recited positions. The motion can be anywhere along a path between the two recited positions, such that, the motion is from a direction of one position toward the other position or from a direction of the other position toward the one position.

Figure 12:
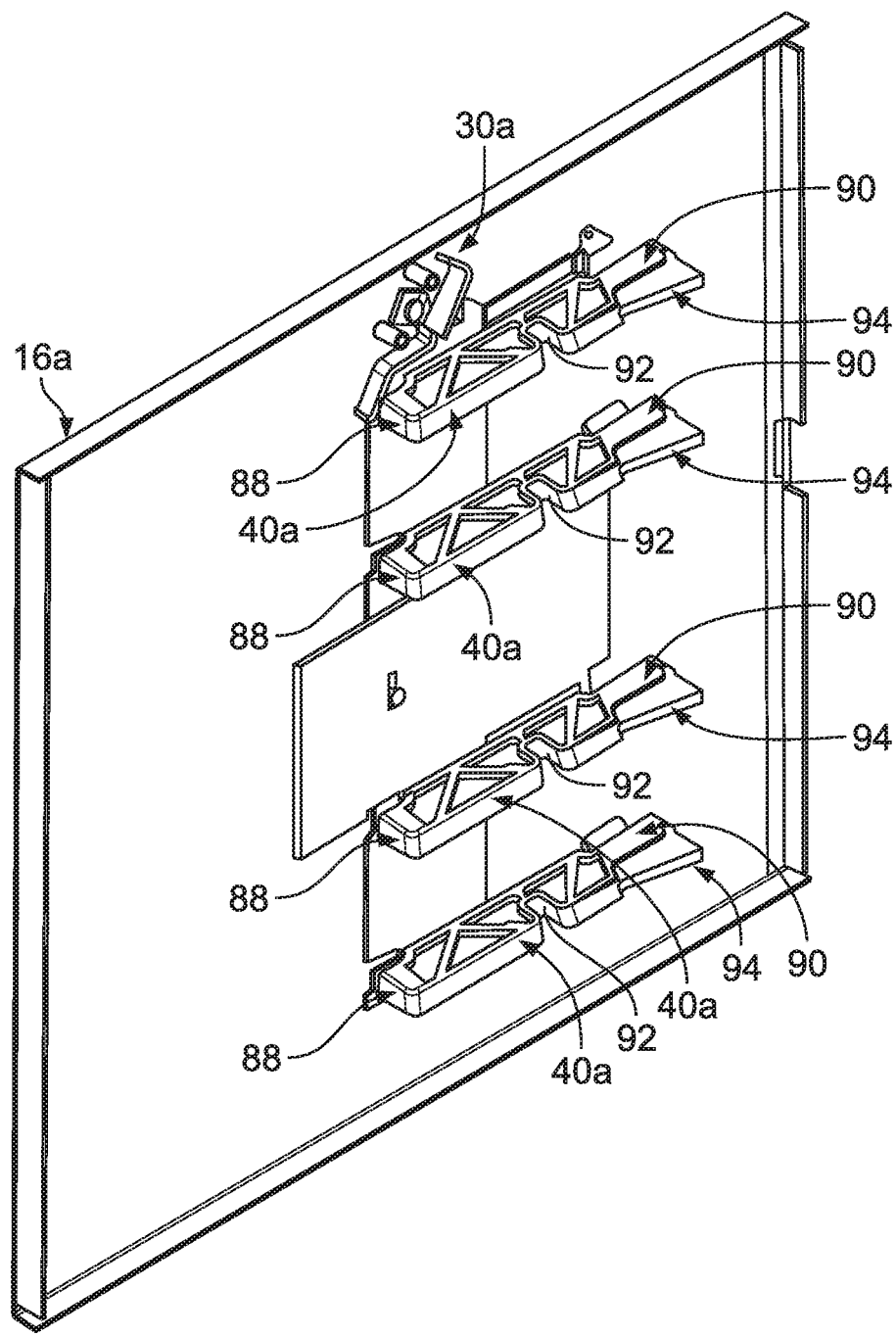
FIGS. 12-14 illustrate another interlock mechanism in accordance with the principles of the present disclosure.
Figure 13:
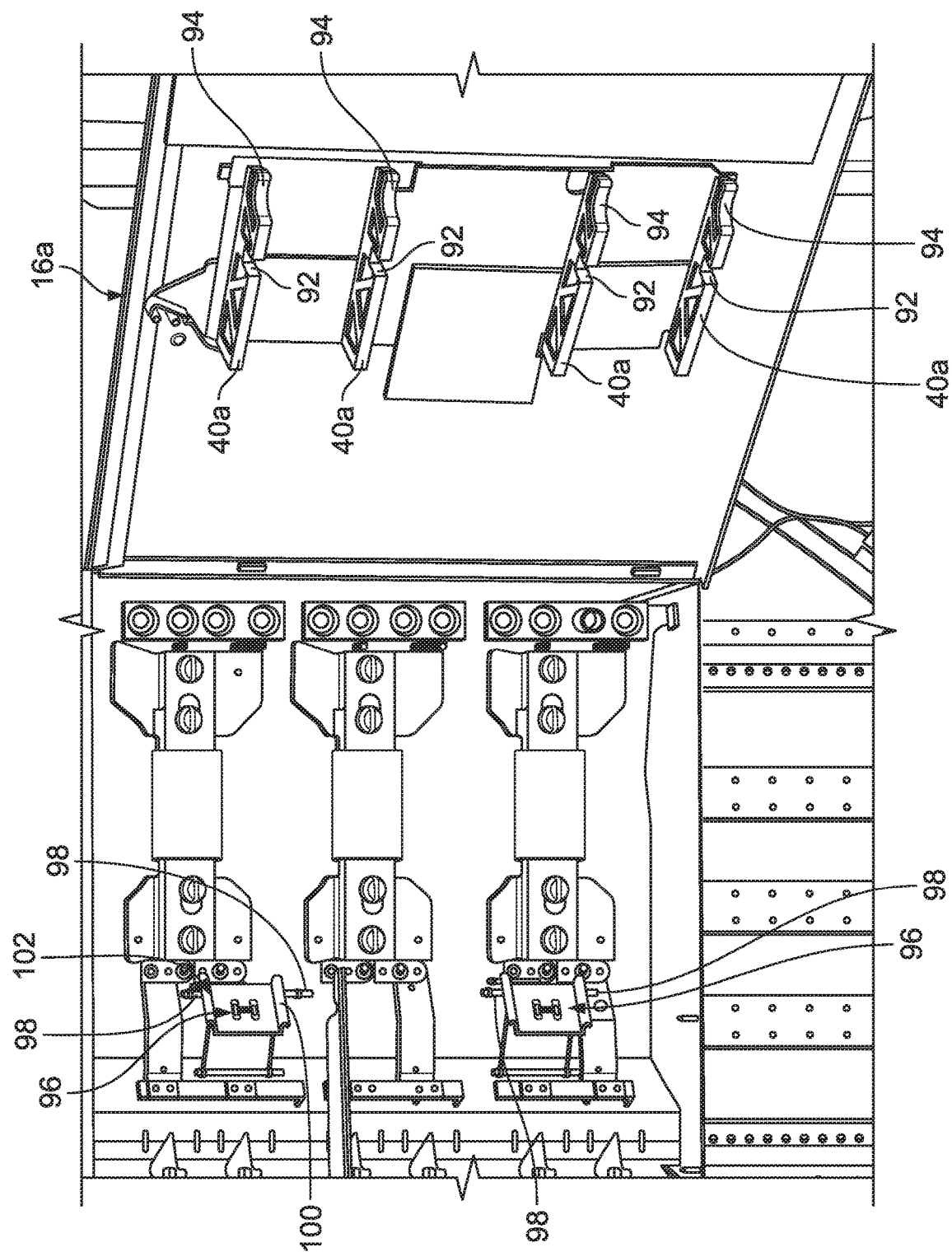
Figure 14:
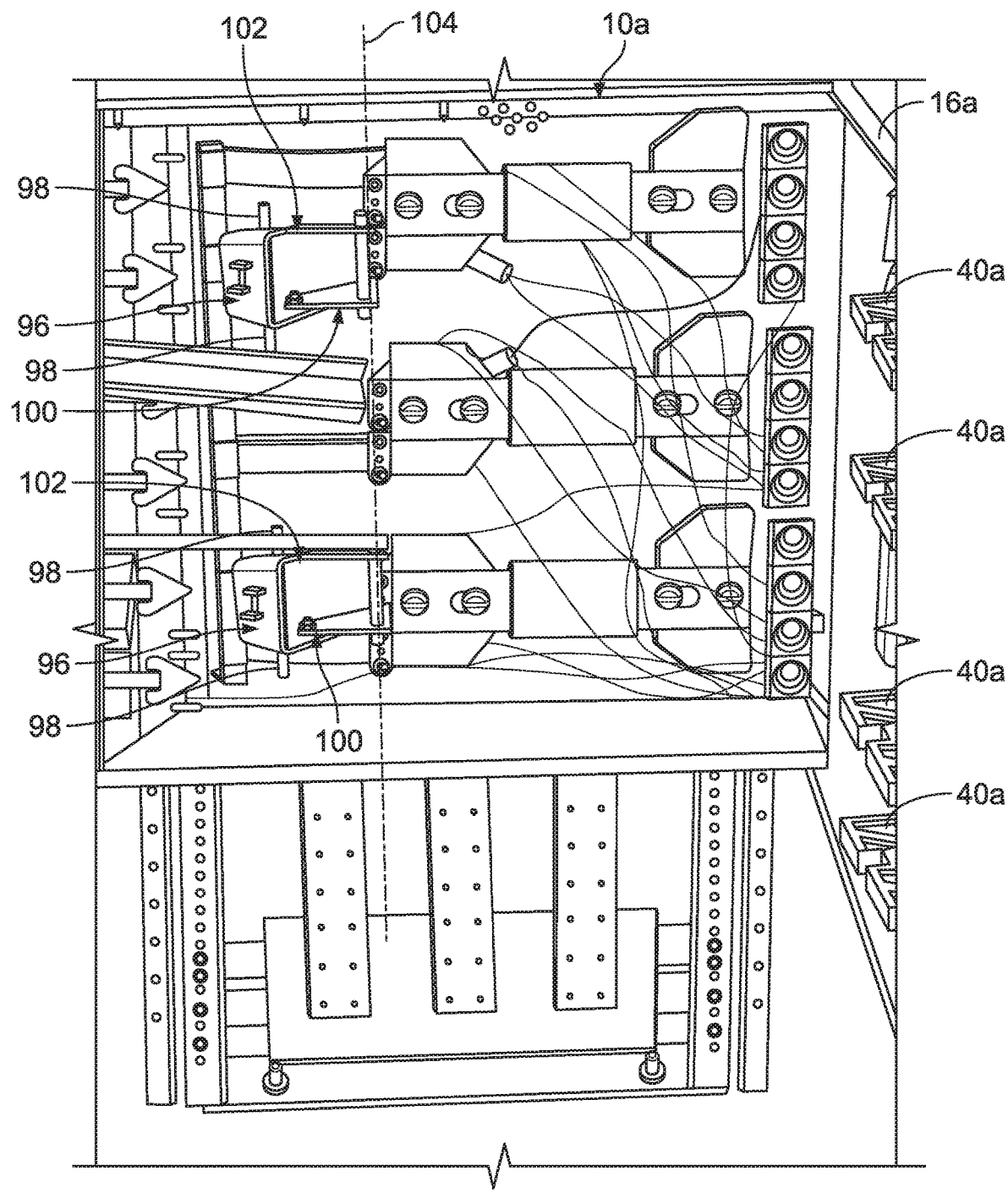

Turing to FIGS. 12-14, an alternative apparatus 10a that includes an operating mechanism 30a for use with another type of enclosure 12a in accordance with the principles of the present disclosure. To the extent that the embodiments are similar, the description will not be repeated and will instead be directed to the primary differences. Specifically, the operating mechanism 30a differs in how the slider and blocking structure engages components within the enclosure 12a.

The operating mechanism 30a includes multiple sliders 40a mounted on an interior surface 32a of a door 16a. In the example shown, there are four sliders 40a although alternatives are possible. The sliders 40a can have a first end 88 and an opposite second end 90. The sliders 40a can each define a slot opening 92 between the first and second ends 88, 90. An engagement member 94 can be positioned at the second ends 90 of the sliders 40a.

Similar to the enclosure 10, a control handle can be mounted on the outside surface of the door 16a where the control handle can be pivotally movable about a handle axis between an OFF position and an ON position and the door can be movable between an open door position and a closed door position. The operating mechanism 30a functions to move the sliders 40a linearly between first and second slider positions as the control handle is pivoted about a handle axis. The sliders 40a are in the first slider position (see FIG. 13) when the control handle is in the OFF position and the sliders 40a are in the second slider position when the control handle is in the ON position.

Switches 96 can be housed in the enclosure 12a as described above. The engagement member 94 can be configured to prevent the door 16a from being moved to the closed door position when the control handle is in the OFF position and the switches 96 are in the closed circuit position.

The switches 96 can each include actuating structures 98 (e.g., bolt, shaft) that extend at opposite sides 100, 102 of the switches 96. The actuating structures 98 are configured to engage the slot opening 92 of the sliders 40a when the door 16a is closed such that the movement of the sliders 40a by the control handle between the first and second slider positions drives pivotal movement of the switches 96 about a switch axis 104 to cause the switches 96 to move between the open circuit position (see FIG. 13) and closed circuit positions (see FIG. 14).

The slot openings 92 of two of the sliders 40a are configured to engage the actuating structures 98 of one of the switches 96 and the slot openings 92 of the other two sliders 40a are configured to engage the actuating structures 98 of the other one of the switches 96. The actuating structures 98 properly engage the slot opening 92 of the sliders 40a when: a) the door 16a is in the closed door position while the control handle is in the OFF position and the switches are in the open circuit position; and b) the door 16a is in the closed door position when the control handle is in the ON position and the switches 96 are in the closed circuit position. When the door 16a is in the open door position, the actuating structures 98 can be disengaged from the slot opening 92 of the sliders 40a such that the control handle can be moved between the OFF and ON positions without moving the switches 96 between the open and closed circuit positions. In other words, when the door 16a is in the open door position, the control handle can be mechanically isolated from the switches 96 such that the control handle can be moved between the OFF and ON positions without moving the switches 96 between the open and closed circuit positions.

The actuating structures 98 move with the switches 96 such that the actuating structures 98 are in a first position (see FIG. 13) when the switches 96 are in the open circuit position and are in a second position (see FIG. 14) when the switches 96 are in the closed circuit position. The actuating structures 98 can be configured to prevent the door 16a from being closed when the control handle is in the OFF position and the switches 96 are in the closed position.

The engagement member 94 of the sliders 40a are configured to oppose the actuating structures 98 to restrict the door 16a from closing. That is, the actuating structures 98 can function as a blocking arm or blocking structure with an interference portion that opposes the engagement member 94 to restrict the door from closing while the control handle is in the OFF position and the switches 96 are in the closed circuit position. The engagement member 94 permits the door 16a to be closed when: a) the control handle is in the OFF position and the switches 96 are in the open circuit position; and b) the control handle is in the ON position and the switches 96 are in the closed circuit position.

Various modifications and alterations of this disclosure will become apparent to those skilled in the art without departing from the scope and spirit of this disclosure, and it should be understood that the inventive scope of this disclosure is not to be unduly limited to the illustrative embodiments set forth herein.

What is claimed is:

1. An apparatus comprising:
   a cabinet including a door having an outside surface and an inside surface, a control handle mounted on the outside surface of the door, the control handle being movable between an OFF position and an ON position, the door being movable between an open door position and a closed door position;
   at least one circuit unit positioned within the cabinet, the at least one circuit unit being movable between an open circuit position and a closed circuit position;
   wherein the control handle is mechanically linked to the at least one circuit unit to drive movement of the at least one circuit unit between the open and closed circuit positions when: a) the door is closed while the control handle is in the OFF position and the at least one circuit unit is in the open circuit position; and b) the door is closed when the control handle is in the ON position and the at least one circuit unit is in the closed circuit position;
   wherein when the door is open, the control handle is mechanically isolated from the at least one circuit unit such that the control handle can be moved between the OFF and ON positions without moving the at least one circuit unit between the open and closed circuit positions;
   a blocking structure that moves with the at least one circuit unit such that the blocking structure is in a first position when the at least one circuit unit is in the open circuit position and is in a second position when the at least one circuit unit is in the closed circuit position, the blocking structure being configured to prevent the door from being closed when the control handle is in the OFF position and the at least one circuit unit is in the closed position; and
   wherein the blocking structure permits the door to be closed when: a) the control handle is in the OFF position and the at least one circuit unit is in the open circuit position; and b) the control handle is in the ON position and the at least one circuit unit is in the closed circuit position.

2. The apparatus of claim 1, further comprising a crank member that is mechanically linked to the at least one circuit unit.

3. The apparatus of claim 2, wherein pivotal movement of the crank member pulls the blocking structure such that an interference portion prevents the door from being closed when the control handle is in the OFF position and the at least one circuit unit is in the closed position and an access portion permits the door to be closed when: a) the control handle is in the OFF position and the at least one circuit unit is in the open circuit position; and b) the control handle is in the ON position and the at least one circuit unit is in the closed circuit position.

4. The apparatus of claim 2, wherein the crank member includes first and second flanges, and the blocking structure is mechanically linked at a pivot location on one of the first and second flanges of the crank member.

5. The apparatus of claim 3, wherein the blocking structure is a L-shaped flange and the access portion is a cutout in the L-shaped flange.

6. The apparatus of claim 5, wherein the L-shaped flange is configured to move about 30 degrees from horizontal.

7. The apparatus of claim 1, wherein the blocking structure includes pins located on opposite sides of the at least one circuit unit.

8. An apparatus comprising:
a cabinet including a door having an outside surface and an inside surface, and a control handle mounted on the outside surface of the door, the control handle being rotatable about a handle axis between an OFF position and an ON position;
a door link assembly arranged on the inside surface of the door, the door link assembly including a slider having engagement prongs that move linearly with the slider between first and second slider positions as the control handle is rotated about the handle axis between the OFF and ON positions;
at least one circuit unit positioned within the cabinet, the at least one circuit unit including an actuator shaft that mechanically links the control handle to the at least one circuit unit, the control handle being configured to drive movement of the at least one circuit unit about a switch axis between open and closed circuit positions when a) the door is closed while the control handle is in the OFF position and the at least one circuit unit is in the open circuit position; and b) the door is closed while the control handle is in the ON position and the at least one circuit unit is in the closed circuit position;
an interlock mechanism including a crank member and a blocking arm coupled to the crank member at a first end, the crank member being rotatable about a crank axis that corresponds to the switch axis, the crank member interconnecting the blocking arm at a pivot location, the blocking arm having an interference portion and an access portion; and
a mounting bracket mounted within the cabinet, the mounting bracket defining a guide opening through which the blocking arm extends, wherein the blocking arm is adapted to slide within the guide opening relative to the mounting bracket as the crank member pivots about the crank axis;
wherein the interference portion of the blocking arm is configured to restrict the door from closing while the control handle is in the OFF position and the at least one circuit unit is in the closed circuit position.

9. The apparatus of claim 8, wherein the engagement prongs of the slider are configured to oppose the interference portion to restrict the door from closing.

10. The apparatus of claim 8, wherein the access portion of the blocking arm permits the engagement prongs of the slider to engage the crank member.

11. The apparatus of claim 8, wherein, when the door is open, the engagement prongs are disengaged from the crank member such that the control handle can be moved between the OFF and ON positions without moving the at least one circuit unit between the open and closed circuit positions.

12. The apparatus of claim 8, wherein the crank member includes first and second flanges, and the blocking arm is mechanically linked at the pivot location on one of the first and second flanges of the crank member.

13. The apparatus of claim 8, wherein the guide opening of the mounting bracket is a L-shaped slot and the blocking arm is a L-shaped flange.

14. The apparatus of claim 13, wherein the L-shaped flange is configured to move about 30 degrees from horizontal.

15. An apparatus comprising:
a cabinet including a door having an outside surface and an inside surface, and a control handle mounted on the outside surface of the door, the control handle being pivotally movable about a handle axis between an OFF position and an ON position, the door being movable between an open door position and a closed door position;
a door link assembly arranged on the inside surface of the door and coupled to the control handle at the handle axis, the door link assembly including a slider having engagement prongs, the slider moving linearly between first and second slider positions as the control handle is pivoted about the handle axis, wherein the slider is in the first slider position when the control handle is in the OFF position and the slider is in the second slider position when the control handle is in the ON position;
at least one circuit unit positioned within the cabinet, the at least one circuit unit including an actuator shaft, the actuator shaft of the circuit unit being pivotally movable about a switch axis to switch the at least one circuit unit between an open circuit position and a closed circuit position;
a crank member connected to the actuator shaft at the switch axis for pivoting the actuator shaft to switch the at least one the circuit unit between the open and closed circuit positions, wherein pivotal movement of the crank member about the switch axis drives pivotal movement of the actuator shaft about the switch axis;
a blocking arm pivotally connected to the crank member at a pivot location offset from the switch axis, the blocking arm having an interference portion;
a mounting bracket mounted within the cabinet, the mounting bracket defining a guide opening through which the blocking arm extends, wherein the blocking arm is adapted to slide within the guide opening relative to the mounting bracket as the crank member pivots about the switch axis;
wherein the engagement prongs of the slider are configured to engage the crank member when the door is closed such that movement of the slider by the control handle between the first and second slider positions drives pivotal movement of the crank member about the switch axis to cause the at least one circuit unit to move between the open and closed circuit positions;
wherein the engagement prongs properly engage the crank member when: a) the door is closed while the control handle is in the OFF position and the at least one circuit unit is in the open circuit position; and b) the door is closed when the control handle is in the ON position and the at least one circuit unit is in the closed circuit position;
wherein when the door is open, the engagement prongs are disengaged from the crank member such that the control handle can be moved between the OFF and ON positions without moving the at least one circuit unit between the open and closed circuit positions; and wherein the interference portion of the blocking arm is configured to oppose the engagement prongs to restrict the door from closing while the control handle is in the OFF position and the at least one circuit unit is in the closed position.

16. The apparatus of claim 15, wherein the crank member includes first and second flanges, and the blocking arm is mechanically linked at a pivot location on one of the first and second flanges of the crank member.

17. The apparatus of claim 16, wherein the first and second flanges of the crank member define an opening.

18. The apparatus of claim 17, wherein the blocking arm includes an access portion that permits the engagement prongs of the slider to engage the opening of the crank member.

19. The apparatus of claim 15, wherein the guide opening of the mounting bracket is a L-shaped slot and the blocking arm is a L-shaped flange.

20. The apparatus of claim 19, wherein the L-shaped flange is configured to move about 30 degrees from horizontal.

* * * * *